(12) United States Patent
Barnabo et al.

(10) Patent No.: US 10,974,596 B2
(45) Date of Patent: Apr. 13, 2021

(54) GEARBOX SHIFT ACTUATOR FOR 4-WHEEL DRIVE VEHICLE

(71) Applicant: Stoneridge Control Devices, Inc., Novi, MI (US)

(72) Inventors: Susan M. Barnabo, Walpole, MA (US); John Sachs, Farmington Hills, MI (US)

(73) Assignee: Stoneridge Control Devices, Inc., Novi, MI (US)

( * ) Notice: Subject to any disclaimer, the term of this patent is extended or adjusted under 35 U.S.C. 154(b) by 0 days.

(21) Appl. No.: 16/871,977

(22) Filed: May 11, 2020

(65) Prior Publication Data
US 2020/0353815 A1 Nov. 12, 2020

Related U.S. Application Data

(60) Provisional application No. 62/845,486, filed on May 9, 2019.

(51) Int. Cl.

| | |
|---|---|
| *B60K 23/08* | (2006.01) |
| *F16H 25/20* | (2006.01) |
| *F16H 1/28* | (2006.01) |
| *F16H 57/04* | (2010.01) |
| *B60K 23/04* | (2006.01) |

(Continued)

(52) U.S. Cl.
CPC .............. *B60K 23/08* (2013.01); *B60K 23/04* (2013.01); *B60Q 3/70* (2017.02); *F16D 11/14* (2013.01); *F16H 1/28* (2013.01); *F16H 25/2015* (2013.01); *F16H 57/0497* (2013.01); *G01D 5/145* (2013.01); *F16D 2011/004* (2013.01); *F16H 2025/2075* (2013.01); *F16H 2025/2087* (2013.01)

(58) Field of Classification Search
CPC ............ B60K 17/34; B60K 2023/0891; B60K 2025/02; B60K 28/066; B60K 23/04; F16D 13/16; F16D 13/28; F16H 1/2827; F16H 1/2845; F16H 25/2015; F16H 2025/2084; F16H 25/20; F16H 2025/249; G01D 5/145
USPC ....................................................... 475/150
See application file for complete search history.

(56) References Cited

U.S. PATENT DOCUMENTS

| | | |
|---|---|---|
| 5,788,008 A | 8/1998 | Fort et al. |
| 7,197,955 B2 | 4/2007 | Sharma et al. |

(Continued)

*Primary Examiner* — Charles A Fox
*Assistant Examiner* — Tracey E. Bell
(74) *Attorney, Agent, or Firm* — Carlson, Gaskey & Olds, P.C.

(57) ABSTRACT

A gearbox operating system shifts between 2-wheel and 4-wheel drive. The system includes a reversible motor, and a reduction gear train that is configured to be driven by the motor to move a plunger between extended and retracted plunger positions that shifts gears. A printed circuit board has at least two Hall effect sensing circuits. A magnet is carried by the reduction gear train and is rotationally movable relative to the Hall effect sensing circuits. A first Hall effect sensing circuits provides a first output signal indicative of the extended plunger position. A second Hall effect sensing circuits provides a second output signal that is indicative of the retracted plunger position. A controller monitors the two Hall effect sensing circuits to determine if a desired plunger position has been achieved and trigger an error code if the desired plunger position has not been achieved within a predetermined response time.

18 Claims, 6 Drawing Sheets

(51) Int. Cl.
*F16D 11/14* (2006.01)
*G01D 5/14* (2006.01)
*B60Q 3/70* (2017.01)
*F16D 11/00* (2006.01)

(56) References Cited

U.S. PATENT DOCUMENTS

| | | | | |
|---|---|---|---|---|
| 15,613,609 | * | 3/2010 | Ganter | F16H 61/32 |
| 10,487,544 B2 | * | 11/2019 | Ainley | E05B 47/026 |
| 2009/0158868 A1 | * | 6/2009 | Farmer | B60G 21/0556 74/49 |

* cited by examiner

GEARBOX SHIFT ACTUATOR FOR 4-WHEEL DRIVE VEHICLE

CROSS-REFERENCE TO RELATED APPLICATION

This application claims priority to U.S. Provisional Application No. 62/845,486 filed on May 9, 2019.

BACKGROUND OF THE INVENTION

The value of 4-wheel drive in utility and commercial vehicles has long been recognized. It is commonplace for 4-wheel drive to be utilized in heavy-duty construction, transport, military and other operations, especially in rough terrain or in snow, mud or sand. In more recent years, a market has developed for 4-wheel drive operation of sport vehicles and even passenger vehicles for winter driving. For reasons of original cost, expense of operation, and general inconvenience associated with full-time 4-wheel drive, it has proven desirable to have systems in which the operator has the option of selecting 2 or 4-wheel drive depending on the conditions at any given time. To do so, vehicles having both front and rear-wheel drive systems have been offered.

Normally, only the rear wheels would be the driving wheels, and when it was desired to operate under 4-wheel drive, it was necessary for the driver to leave the vehicle and manually lock the hubs of the front wheels in order that 4-wheel drive could be engaged. This inconvenient and relatively crude expedient tended to limit the acceptance of such vehicles in the lighter vehicle market, and some efforts have been made to provide systems in which 4-wheel drive can be invoked by the driver without his having to leave the cab of the vehicle. These newer remotely operated systems have achieved some success but, for the most part, they have been costly and/or somewhat unreliable.

One type of inexpensive, highly reliable actuator for 4-wheel drive vehicles incorporates a wiper mounted to a switch gear that selectively makes an electrical connection with contacts on an adjacent printed circuit board (PCB) as the switch gear rotates to extend and retract a plunger. One PCB contact corresponds to an extended plunger position, and another PCB contact corresponds to a retracted plunger position. With this type of arrangement, either no voltage output or a voltage output approximately equal to the supply voltage minus 2 volts is provided to a single pin of the actuator electrical connector relative to ground. A "high" voltage at the pin means the actuator is in 4WD (plunger extended) position. If there is no output voltage at the pin, the actuator is either in 2WD (plunger retracted) or could be in transition. In the case of a slow shift or a stuck/malfunctioning actuator, very little information can be derived from this single actuator.

The physical wiper contact arrangement was replaced with a dual Hall effect sensor on the PCB and a magnet on the switch gear. This configuration simulated the previous simple wiper/contact arrangement, but without any improvement in actuator or shifting diagnostics.

SUMMARY OF THE INVENTION

In one exemplary embodiment, a gearbox operating system for shifting between 2-wheel and 4-wheel drive in a vehicle by remotely engaging and disengaging a differential output shaft with a wheel output shaft, the differential output shaft and the wheel output shaft have externally splined outer ends, an internally splined ring normally fully engages the wheel output shaft and axially moveable thereon, a fork for moving the splined ring axially into engagement with the splined outer end of the differential output shaft, the gearbox includes, among other things, an actuator that is mounted on the housing of the differential drive system and has a plunger that is configured to move the fork a predetermined linear distance to cause the splined ring to engage and disengage the differential output shaft while maintaining engagement with the wheel output shaft. The system also includes a drive nut that is threaded on a lead screw. A compression spring is disposed between the drive nut and the plunger. The system further includes a reversible motor, and a reduction gear train that is configured to be driven by the motor. The gear train is connected to the lead screw. The motor is configured to rotate at relatively high speed and low torque and the lead screw is configured to rotate at relatively high torque and low speed by virtue of the reduction gear connection. The motor is configured to be energized by a command signal to rotationally drive the lead screw via the reduction gear train to linearly move the plunger between extended and retracted plunger positions that causes the fork to move the splined ring axially between the differential output shaft and the wheel output shaft. The system further includes a position sensing array that includes a printed circuit board that has at least two Hall effect sensing circuits. At least one magnet is carried by the reduction gear train and is rotationally movable relative to the at least two Hall effect sensing circuits. A first of the at least two Hall effect sensing circuits provides a first output signal indicative of the extended plunger position. A second of the at least two Hall effect sensing circuits provides a second output signal that is indicative of the retracted plunger position. The system further includes a controller that is in communication with the printed circuit board. The controller is configured to monitor the at least two Hall effect sensing circuits to determine if a desired plunger position has been achieved and trigger an error code if the desired plunger position has not been achieved within a predetermined response time.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
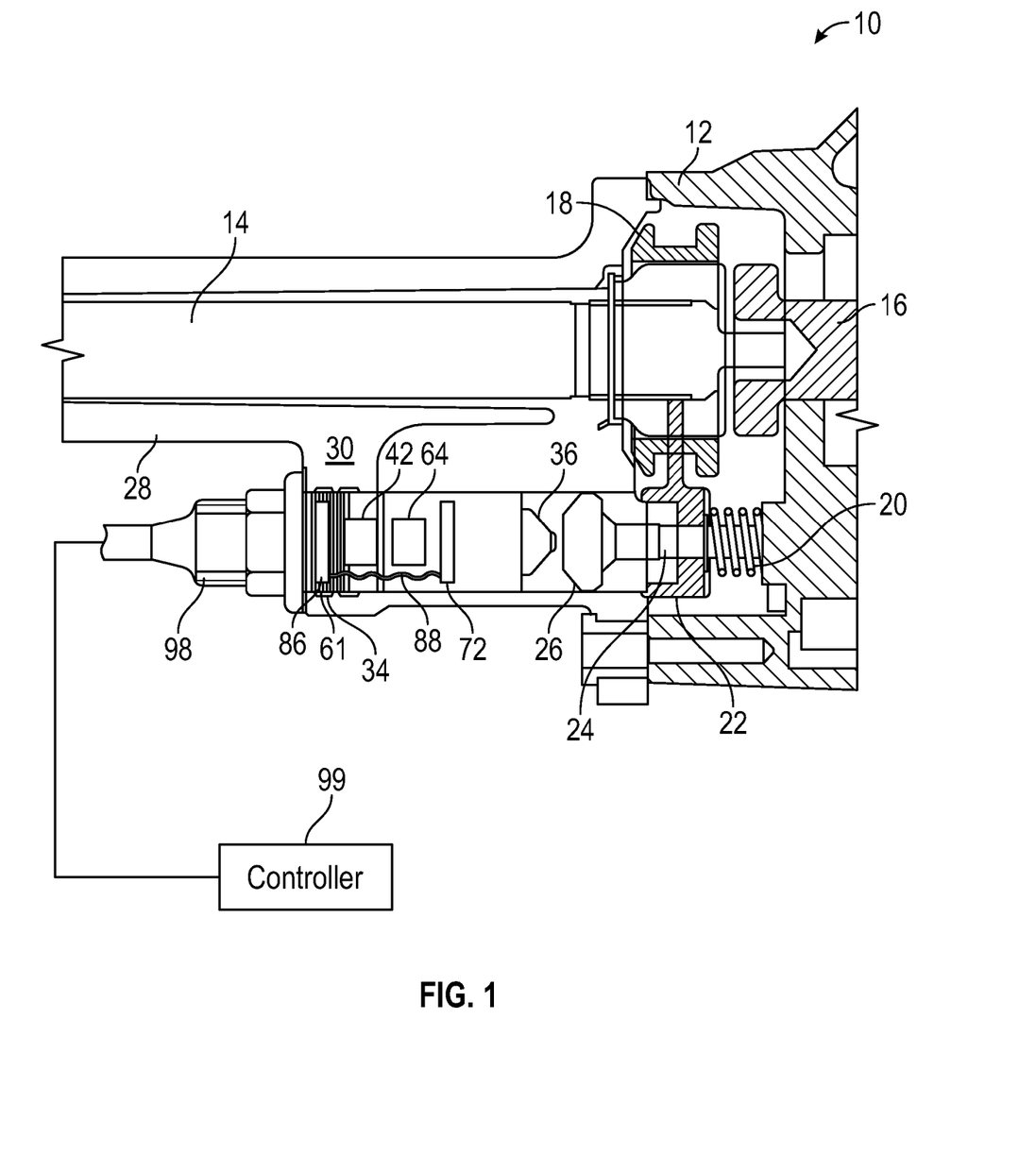
FIG. 1 is a view partly in section of a portion of the front differential of a 4-wheel drive vehicle having an actuator mounted on the differential housing.

In FIG. 1, there may be seen in part a front differential housing 12 typical of gearbox operating systems 10 utilized in 4-wheel drive vehicles. Extending out from the housing to the left is a wheel output shaft 14 and extending outward through the housing to the right is a differential output shaft 16. When the vehicle is proceeding normally with 2-wheel drive in operation, only the rear wheels are driving the vehicle and the front differential will be set up as it appears in FIG. 1. That is, there will be no direct connection between the differential output shaft 16 and the wheel output shaft 14.

In that circumstance, an internally splined ring 18 is engaged on the externally splined end of the wheel output shaft 14. The axial position of the splined ring 18 on the wheel output shaft 14 is controlled by a fork 22. The fork 22 is mounted on a reciprocating shaft 24 having an end knob 26, and is normally urged in a leftward direction by a spring 20. The wheel output shaft 14 is surrounded by an enclosure 28 having a radial extension 30. The extension 30 has an opening formed through its wall which is threaded to receive matching threads of the body of an actuator 34. The actuator 34 has a plunger 36 which is axially reciprocable in the actuator body. The plunger 36 contacts the knob 26 and in its forward motion out of the actuator body, pushes the knob and its support shaft 24 from left to right as seen in the drawing. As the shaft 24 moves to the right, it carries the fork 22 with it against spring pressure, and the splined ring is moved about one inch from left to right to engage the splines on the exterior of the differential output shaft if they are aligned with the splines of the ring 18. If, on the other hand, the two sets of splines are misaligned, the plunger 36 is urged against the knob 26 by the action of a compression spring (82, FIG. 2) in the actuator. The pressure of the actuator spring is applied to the splined ring through the fork 22 and as soon as there is any relative movement between the gear controlling the position of the wheel output shaft 14 and the differential output shaft 16 the splined ring will pop into position on the end of the differential output shaft, then engaging both the wheel output shaft and differential output shaft.

Figure 2:
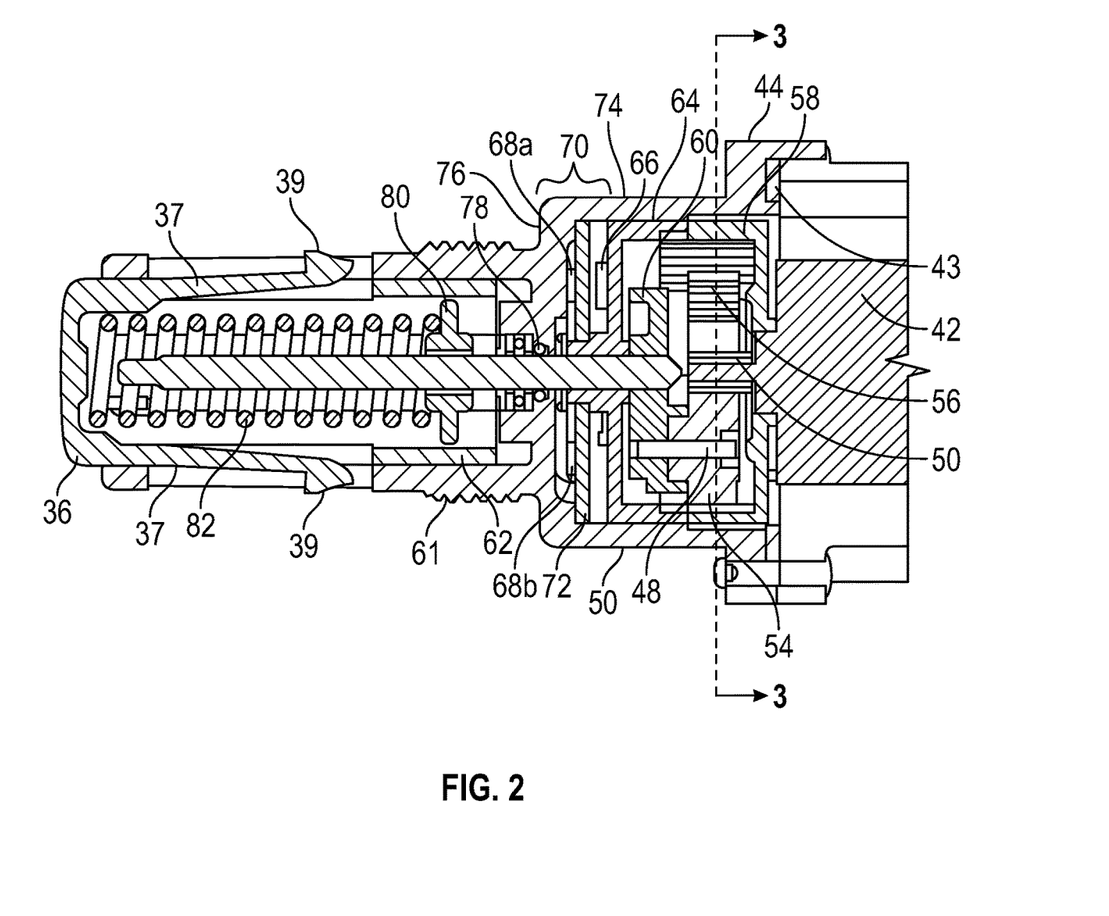
FIG. 2 is a sectional view of the linear actuator of FIG. 1.
Figure 3:
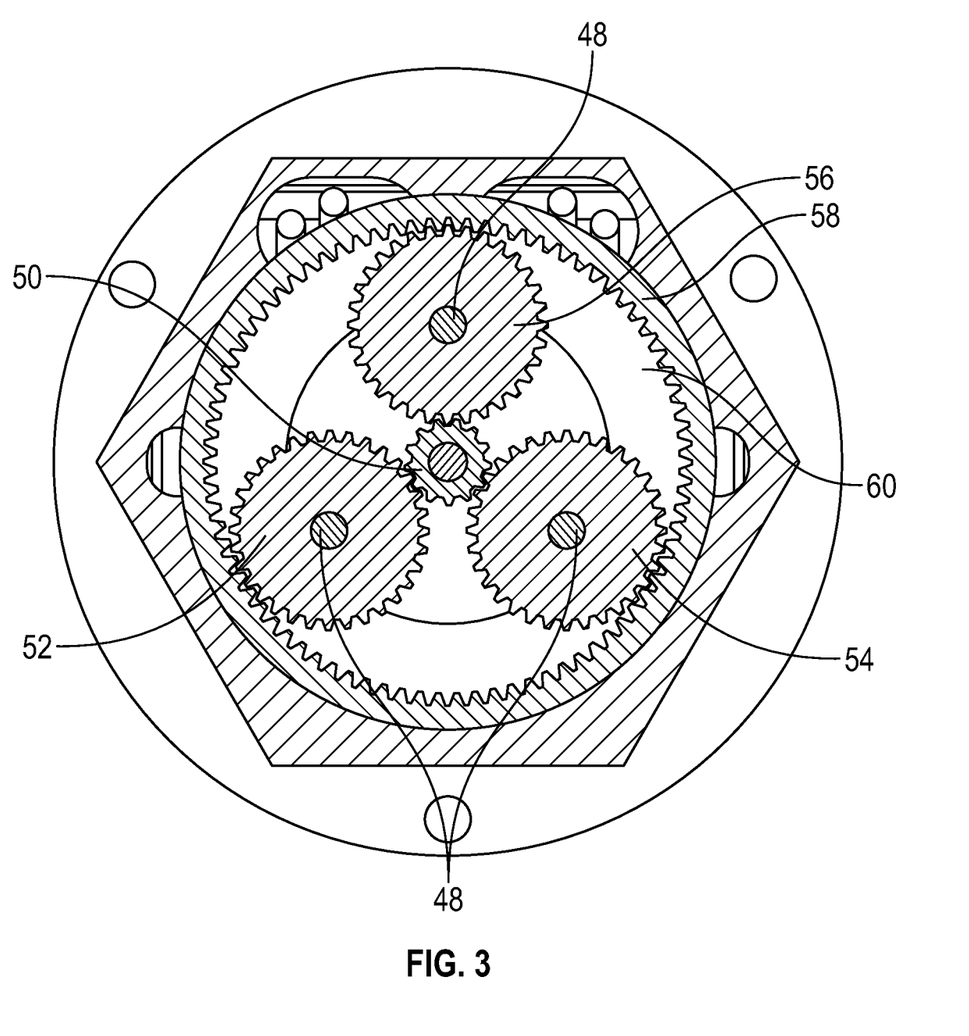
FIG. 3 is a cross-sectional view taken along the line 3-3 of FIG. 2.

In the sectional view of FIG. 2, detail of the actuator 34 may be seen. Basic drive for the device is provided by a reversible motor 42 which may be a permanent magnet DC motor. The motor 42 is fitted into a housing which is riveted to the end of an actuator body 44, a suitable gasket 43 being provided between the two items. Fixed to, or forming a part of the motor housing is a power ring gear 58. The output shaft of the motor 42 extends through the center of the power ring gear 58 and rotates a sun gear 50 of a planetary group mounted for rotation on a carrier 60 via shafts 48 as shown in FIG. 3. Surrounding the sun gear 50 are planet gears 52, 54 and 56. It will be noted that the sun gear 50 meshes with all three planet gears, which in turn mesh with the ring gear 58, which is the power ring gear of the device.

A lead screw 62 is fixed in the center of the carrier 60. Surrounding the carrier is an internally toothed switch ring gear 64 similar in most respects to the power ring gear 46. The switch ring gear 64 meshes with only one of the planet gears, namely, the gear 52, which is extended axially relative to the planet gears 54 and 56 by an amount sufficient for it to mesh with the switch ring gear 64.

On the bottom of the switch ring gear 64, there is mounted at least one magnet 66 that provides a portion of a position sensing array 70 used to determine whether the plunger 36 has achieved the extended plunger position or the retracted plunger position. The position sensing array 70 includes a first printed circuit board (PCB) 72 that is provided as a disk of about the same diameter as, and fixed in juxtaposition to, the switch ring gear 64. The first PCB 72 includes at least two Hall effect sensing circuits 68a, 68b that cooperate with the magnet 66 to determine the rotational position of the switch ring gear 64, and thus the linear position of the plunger 36.

The position sensing array can be configured to provide redundant output, and/or linear output and/or continuous digital output (such as PWM, SPI or STEP) and/or additional diagnosable states. The additional states can be added to determine more information about location and/or directionality. There are several magnet configurations that can be utilized on the switch gear. The hall effect technology can be analog or digital. It can be enclosed in one hall device, or encompass several. Depending upon the output signal desired for position sensing array 70, multiple magnets can be mounted to the switch ring gear 64 or multi-pole ring magnet can be used.

A second PCB 86 is arranged within the actuator body 44 near an outer end. The second PCB 86 includes control circuitry for the motor 42 and an electrical connector 98 connector that is connected to a controller 99 for the gearbox operating system 10. The first and second PCBs 72, 86 are connected to one another via a ribbon 88, for example.

The actuator body 44 has a first stepped-down section 74 within which the components described immediately above are contained. A further step reduces the body to the diameter on which the threaded section 61 is formed. The lead screw 62, which is fixed in the carrier 60, extends through an end wall 76 which separates the oil-filled section of the distributor housing from the outer section. An O-ring 78 is provided to maintain an isolating seal between the two volumes. The first and second PCBs 72, 86 and their interconnecting ribbon 88 are arranged in a "dry" area of the actuator 34, isolated from the gear oil. Threaded on the lead screw 62 is a drive nut 80. A compression spring 82 bears upon the drive nut 80 and upon the interior of the plunger 36. The plunger 36 may be provided with guides 37 which reciprocate in slots 38 in the body of the actuator to maintain the orientation of the plunger 36 constant. The guides 37 have hooks 39 which limit the travel of the plunger by contacting the ends of their slots.

When the operator of the vehicle invokes the actuator, which may be effected by means of a single pole-double throw switch mounted in the cab, the shaft of the motor 42 rotates at a relatively high speed of about 11,000 rpm at its peak. Torque of the motor shaft is amplified by the planetary gear reduction set composed of the power ring gear 58, The planet gears 52, 54 and 56, and the carrier 60. The lead screw 32 fixed in the carrier rotates in the drive nut 80, which moves linearly to transfer motion to the plunger 36 through the spring 82. When the linear movement is complete, a feedback signal is sent to the operator to indicate engagement of the 4-wheel drive. This latter function is provided by utilizing a second ring gear, namely, the switch gear 64. The switch gear 64 is rotatable and has 84 teeth, while the power ring gear is fixed and has 83 teeth. Thus, during one full revolution of the carrier and lead screw, the switch ring gear rotates 1/84 of a revolution. Therefore, the switch ring gear rotates less than a revolution over the total linear movement of the drive nut and plunger, which is about one inch. This permits the use of simple wiping contacts and a printed circuit board 72 as described or a cam-activated switch on the sealed side of the O-ring to sense the position of the splined ring. In one arrangement, voltage to energize a signal lamp in the cab of the vehicle is switched from the inner conductive ring to the outer ring of the printed circuit board 72 as the switch ring gear 64 completes its travel, the vehicle then being in 4-wheel drive.

Figure 4:
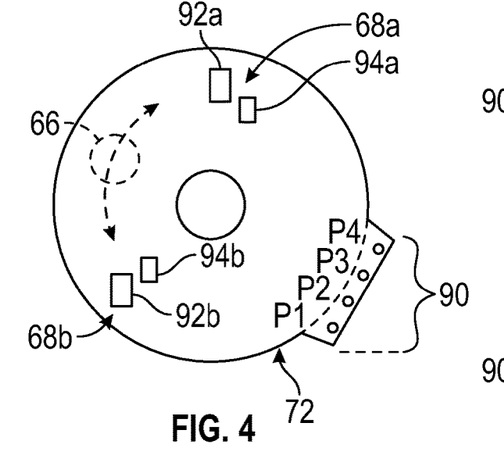
FIG. 4 is an end view of a first printed circuit board (PCB) illustrating a position sensing array.
Figure 5A:
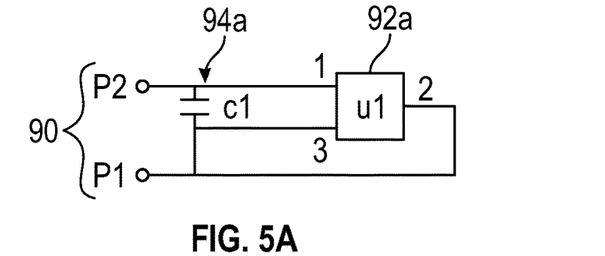
FIGS. 5A and 5B respectively illustrate first and second Hall effect sensing circuits on the PCB of FIG. 4.
Figure 5B:
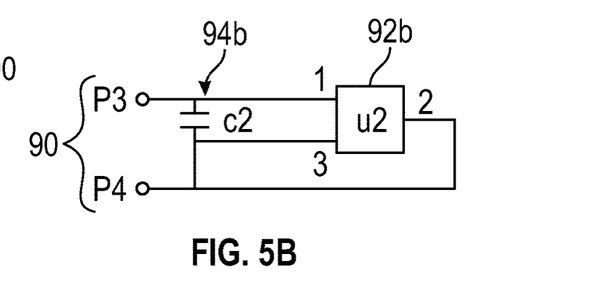

One example first PCB 72 and it position sensing array 70 is schematically illustrated in FIG. 4. In the example, the first and second Hall effect sensing circuits 68a, 68b are arranged circumferentially apart from one another. Each sensing circuit 68a, 68b respectively includes a Hall effect sensor 92a, 92b and a capacitor 94a, 94b arranged as illustrated in FIGS. 5A, 5B, for example. The connections between the sensors 92a, 92b and the capacitors 94a, 94b are provided as traces on the PCB 72, which are not shown for simplicity. The sensing circuits 68a, 68b terminate at pinouts P1-P4.

Figure 6:
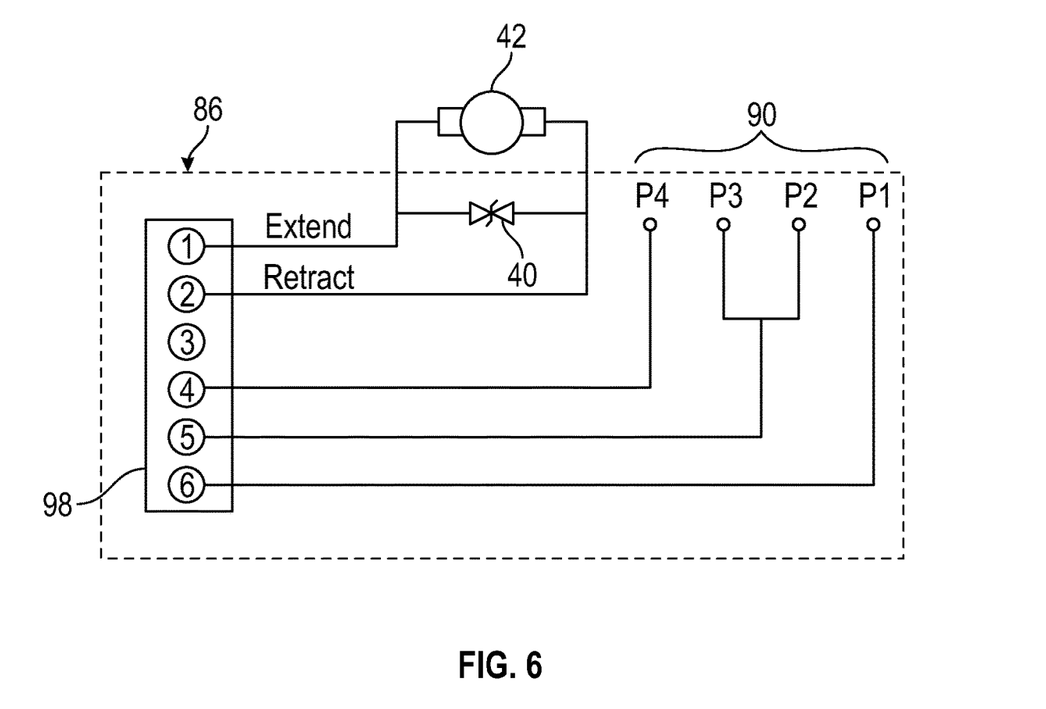
FIG. 6 is a schematic of a second PCB and an electrical connector.

The second PCB 86 provides the electrical connector 98 with Terminals 1-6. A diode 40 is provided on the second PCB 86 and is electrically connected between the leads of the motor 42, which are connected to Terminals 1 and 2. Terminal 3 is unused in the example. Terminal 4 is connected to pinout P4 on the second PCB 86, Terminal 5 is connected to pinouts P2 and P3, and Terminal 6 is connected to pinout P1. The pinouts on the first PCB 86 is connected to the corresponding pinouts on the second PCB 86 via the ribbon 88 (FIG. 1).

In operation, the first Hall effect sensing circuit 68a provides a first output signal indicative of the extended plunger position, and the second Hall effect sensing circuit 68B provides a second output signal indicative of the retracted plunger position. The controller 99, which may be provided internally or externally with respect to the actuator body 44, is configured to monitor the Hall effect sensing circuits 68a, 68b and their output signals (100a, 100b in FIG. 7) to determine if a desired plunger position has been achieved and trigger an error code if the desired plunger position has not been achieved within a predetermined response time.

Figure 7:
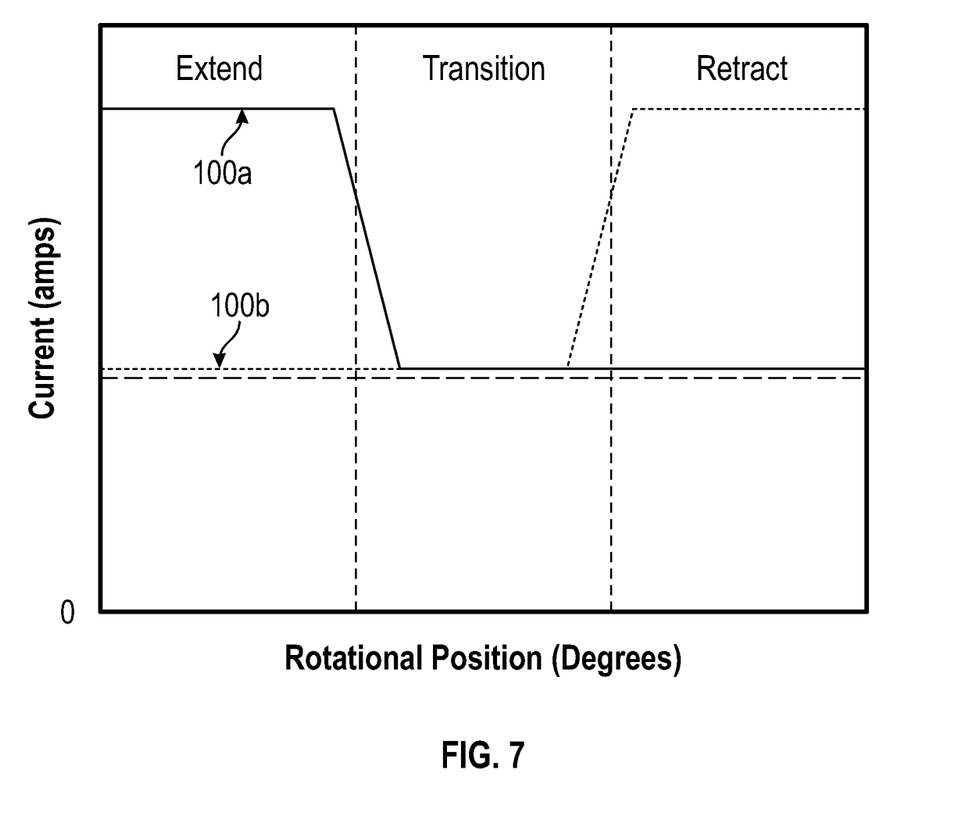
FIG. 7 is a graph illustrating a current output for each of the first and second Hall effect sensing circuits during rotation of a switch gear relative to the first PCB

Referring to FIG. 7, each of the first and second Hall effect sensing circuits 68a, 68b have three signal states: a positive position state, a transition state and a negative position state; wherein the positive position state has a first current, the negative position state has a second current less than the first current, and the transition state has a falling current from the first current to the second current. In one example, the first current is between 12 and 17 amps, and the second current is between 5 and 6.9 amps. In the extended plunger position, the first Hall effect sensing circuit 68a corresponds to its first current and the second Hall effect sensing circuit 68b corresponds to its second current (shown as "EXTEND" in FIG. 7). Conversely, in the retracted plunger position, the second Hall effect sensing circuit 68b corresponds to its first current and the first Hall effect sensing circuit 68a corresponds to its second current (shown as "RETRACT" in FIG. 7).

For each Hall effect sensing circuit, monitoring current over two pins can provide multiple states of the actuator. If current is low (between 5 and 6.9 amps) that means the magnet 66 is not at the Hall effect sensor; if the current is high (between 12-17 amps) that means the magnet 66 is at the Hall effect sensor. No current means that there is an electrical discontinuity in the circuit, which is indicative of a break in the wiring harness or a short in the system, for example. Example actuator states (Terminals 4 and 6 being output signal pins):

2WD: Terminal 4: High, Terminal 6: Low
Transition: Terminal 4: Low, Terminal 6: Low
4WD: Terminal 4: Low, Terminal 6: High An example method of operating the system 10 is illustrated at 102 in FIG. 8. The actuator 36 is provided a command input to move the plunger 36 to either the extended plunger position or the retracted plunger position to shift the gearbox to a desired gear position, as indicated at block 104. The controller 99 monitors the Hall effect sensing circuits 68a, 68b (block 106). If either or both of the Hall effect sensing circuits 68a, 68b have reached their output signal thresholds (block 108; e.g., as shown in FIG. 7), then the desired plunger and corresponding gear position has been achieved (block 110). In this case, a gear indicator light may be illuminated (block 111), for example, a light on the vehicle console indicating "2WD" or "4WD").

Figure 8:
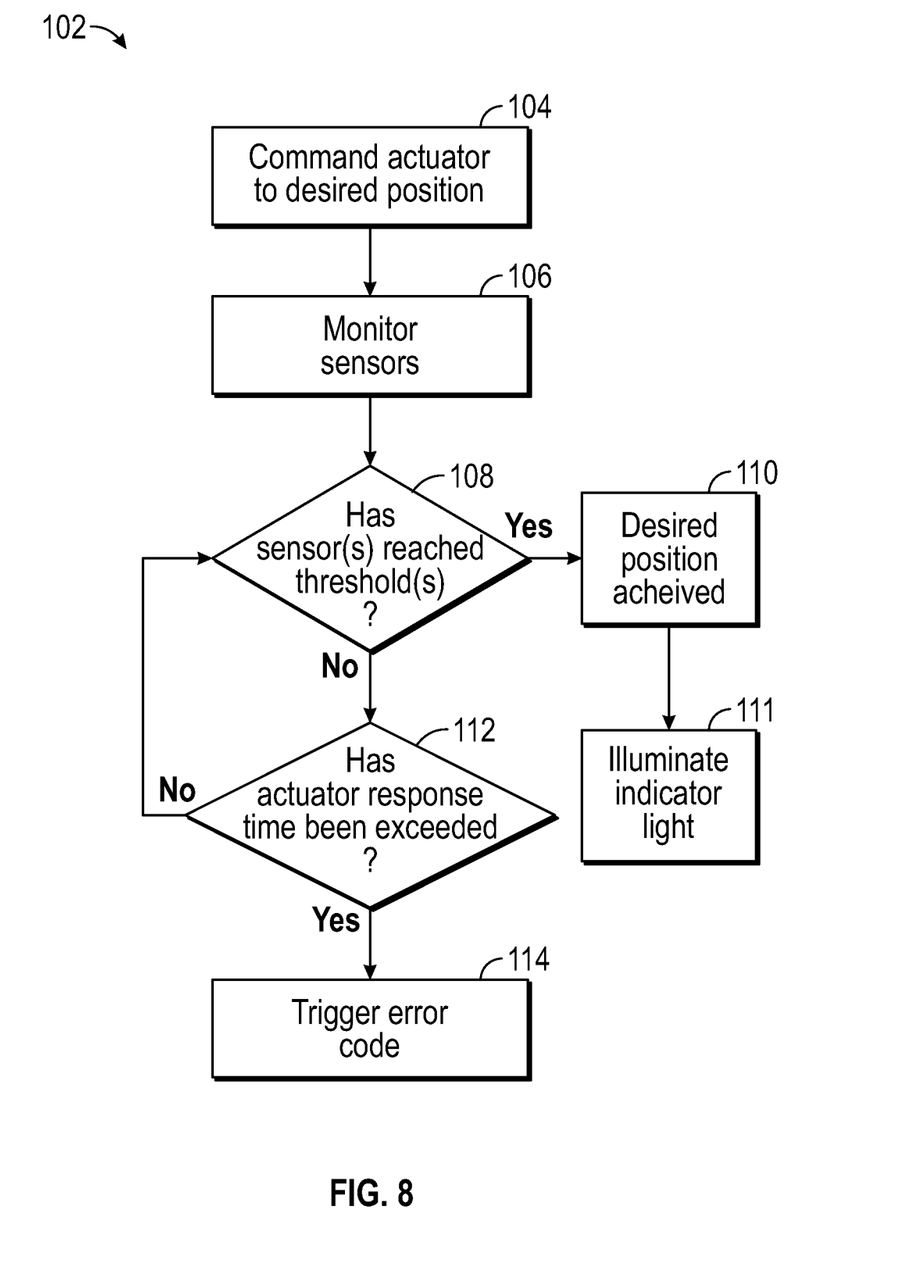
FIG. 8 is a method of sensing a position of the actuator.

If the desired position has not been achieved within a predetermined response time (block 112), for example, within 3 second of the command input, then an error code is triggered (block 114). The error code may be part of an OBDII diagnostic scheme in which a warning light is illuminated indicating a system repair may be needed. Such an error code may be indicative of an actuator failure or a gearbox shifting issue.

The disclosed actuator provides continuous diagnosable output for the entire rotation of the switch ring gear 64, rather than simple outputs at discrete locations like the previous wiper arrangement. The prior art utilized switches to determine the location of the switch ring gear 64, but only provided an open state or voltage that is inherently non-diagnosable. The disclosed actuator has the ability to provided redundant output, and/or linear output and/or continuous digital output (such as PWM, SPI or STEP) and/or additional diagnosable states. The additional states can be added to determine more information about location and/or directionality. There are several magnet configurations that can be utilized on the switch ring gear 64.

The Hall effect circuitry can be analog or digital, and can be enclosed in one Hall device or several. The Hall effect circuitry used to determine the location of the switch ring gear will be diagnosable. Linear information and/or continuous digital information and/or additional states will allow for more robust control of the actuator. The actuator can either be internally or externally controlled It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A gearbox operating system for shifting between 2-wheel and 4-wheel drive in a vehicle by remotely engaging and disengaging a differential output shaft with a wheel output shaft, the differential output shaft and the wheel output shaft having externally splined outer ends, an internally splined ring normally fully engaging the wheel output shaft and axially moveable thereon, a fork for moving the splined ring axially into engagement with the splined outer end of the differential output shaft, the gearbox comprising:
- an actuator mounted on the housing of the differential drive system and having a plunger configured to move the fork a predetermined linear distance to cause the splined ring to engage and disengage the differential output shaft while maintaining engagement with the wheel output shaft;
- a drive nut threaded on a lead screw, and a compression spring disposed between the drive nut and the plunger;
- a reversible motor, and a reduction gear train configured to be driven by the motor, the gear train being connected to the lead screw, the motor configured to rotate at relatively high speed and low torque and the lead screw configured to rotate at relatively high torque and low speed by virtue of the reduction gear connection, the motor configured to be energized by a command signal to rotationally drive the lead screw via the reduction gear train to linearly move the plunger between extended and retracted plunger positions causing the fork to move the splined ring axially between the differential output shaft and the wheel output shaft;
- a position sensing array including a printed circuit board having at least two Hall effect sensing circuits, and at least one magnet carried by the reduction gear train and rotationally movable relative to the at least two Hall effect sensing circuits, wherein a first of the at least two Hall effect sensing circuits provides a first output signal indicative of the extended plunger position, and a second of the at least two Hall effect sensing circuits provides a second output signal indicative of the retracted plunger position; and
- a controller is in communication with the printed circuit board, the controller configured to monitor the at least two Hall effect sensing circuits to determine if a desired plunger position has been achieved and trigger an error code if the desired plunger position has not been achieved within a predetermined response time, wherein the printed circuit board provides a first circuit board, and comprising a second circuit board arranged within the actuator remotely from the first circuit board, the second circuit board having a diode that is electrically connected between power leads of the motor, the second circuit board having a connector that is electrically connected to the controller which is arranged external to the actuator.

2. The system of claim 1, wherein the reduction gear train includes a carrier and a planetary gear system, the planetary gear system including planet gears configured to rotate upon the carrier, the lead screw being centrally fixed in the carrier, the motor having a housing and an output shaft rotating at relatively high speed, the planetary gear system further including a sun gear fixed to the motor output shaft, an internally toothed power ring gear fixed to the housing and meshing with the planet gears, and an internally toothed switch ring gear surrounding the carrier and meshing with one of the planet gears, whereby the carrier and lead screw rotate at relatively low speed, causing linear movement of the plunger and the splined ring, wherein the at least one magnet is mounted to the switch ring gear.

3. The system of claim 2, wherein the printed circuit board is fixed within the actuator axially between the switch ring gear and the drive nut.

4. The system of claim 3, wherein the plunger, the compression spring, and the drive nut are in a gear oil environment in the housing of the differential drive system, an O-ring oil seal being provided about the lead screw, whereby the motor, the reduction gear train, and the printed circuit board are isolated from the gear oil.

5. The system of claim 2, wherein the switch ring gear and the power ring gear have unequal numbers of teeth, a single revolution of the carrier and lead screw causing only a fraction of a revolution of the switch ring gear, the switch ring gear rotating less than a full revolution during motion of the drive nut and plunger over the total range of linear distance.

6. A gearbox operating system for shifting between 2-wheel and 4-wheel drive in a vehicle by remotely engaging and disengaging a differential output shaft with a wheel output shaft, the differential output shaft and the wheel output shaft having externally splined outer ends, an internally splined ring normally fully engaging the wheel output shaft and axially moveable thereon, a fork for moving the splined ring axially into engagement with the splined outer end of the differential output shaft, the gearbox comprising:
- an actuator mounted on the housing of the differential drive system and having a plunger configured to move the fork a predetermined linear distance to cause the splined ring to engage and disengage the differential output shaft while maintaining engagement with the wheel output shaft;
- a drive nut threaded on a lead screw, and a compression spring disposed between the drive nut and the plunger;
- a reversible motor, and a reduction gear train configured to be driven by the motor, the gear train being connected to the lead screw, the motor configured to rotate at relatively high speed and low torque and the lead screw configured to rotate at relatively high torque and low speed by virtue of the reduction gear connection, the motor configured to be energized by a command signal to rotationally drive the lead screw via the reduction gear train to linearly move the plunger between extended and retracted plunger positions causing the fork to move the splined ring axially between the differential output shaft and the wheel output shaft;
- a position sensing array including a printed circuit board having at least two Hall effect sensing circuits, and at least one magnet carried by the reduction gear train and rotationally movable relative to the at least two Hall effect sensing circuits, wherein a first of the at least two Hall effect sensing circuits provides a first output signal indicative of the extended plunger position, and a second of the at least two Hall effect sensing circuits provides a second output signal indicative of the retracted plunger position; and
- a controller is in communication with the printed circuit board, the controller configured to monitor the at least two Hall effect sensing circuits to determine if a desired plunger position has been achieved and trigger an error code if the desired plunger position has not been achieved within a predetermined response time, wherein each of the first and second Hall effect sensing circuits have three signal states: a positive position state, a transition state and a negative position state; wherein the positive position state has a first current, the negative position state has a second current less than the first current, and the transition state has a falling current from the first current to the second current, and wherein in the extended plunger position the first Hall effect sensing circuit corresponds to its first current and the second Hall effect sensing circuit corresponds to its second current, and wherein in the retracted plunger position the second Hall effect sensing circuit corresponds to its first current and the first Hall effect sensing circuit corresponds to its second current.

7. The system of claim 6, wherein the first and second currents are positive.

8. The system of claim 6, wherein the error code is triggered with both the first and second Hall effect sensing circuits having the second current after the predetermined response time.

9. The system of claim 6, wherein the controller is configured to illuminate an indicator light upon achieving the desired plunger position with the predetermined time.

10. An actuator for shifting a gearbox, the actuator comprising:
an actuator body housing a plunger configured to move a predetermined linear distance between extended and retracted plunger positions respectively corresponding to first and second gear positions;
a drive nut threaded on a lead screw, and a compression spring disposed between the drive nut and the plunger;
a reversible motor, and a reduction gear train configured to be driven by the motor, the gear train being connected to the lead screw, the motor configured to rotate at relatively high speed and low torque and the lead screw configured to rotate at relatively high torque and low speed by virtue of the reduction gear connection, the motor configured to be energized by a command signal to rotationally drive the lead screw via the reduction gear train to linearly move the plunger between the extended and retracted plunger positions;
a position sensing array including a printed circuit board having at least two Hall effect sensing circuits, and at least one magnet carried by the reduction gear train and rotationally movable relative to the at least two Hall effect sensing circuits, wherein a first of the at least two Hall effect sensing circuits provides a first output signal indicative of the extended plunger position, and a second of the at least two Hall effect sensing circuits provides a second output signal indicative of the retracted plunger position, the at least two Hall effect sensing circuits configured to signal if a desired plunger position has been achieved and trigger an error code if the desired plunger position has not been achieved within a predetermined response time, wherein the printed circuit board provides a first circuit board, and comprising a second circuit board arranged within the actuator remotely from the first circuit board, the second circuit board having a diode that is electrically connected between power leads of the motor, the second circuit board having a connector accessible externally to the actuator.

11. The actuator of claim 10, wherein the reduction gear train includes a carrier and a planetary gear system, the planetary gear system including planet gears configured to rotate upon the carrier, the lead screw being centrally fixed in the carrier, the motor having a housing and an output shaft rotating at relatively high speed, the planetary gear system further including a sun gear fixed to the motor output shaft, an internally toothed power ring gear fixed to the housing and meshing with the planet gears, and an internally toothed switch ring gear surrounding the carrier and meshing with one of the planet gears, whereby the carrier and lead screw rotate at relatively low speed, causing linear movement of the plunger and the splined ring, wherein the at least one magnet is mounted to the switch ring gear.

12. The system of claim 11, wherein the printed circuit board is fixed within the actuator axially between the switch ring gear and the drive nut.

13. The system of claim 12, wherein the plunger, the compression spring, and the drive nut are in an environment in the housing, an O-ring oil seal is provided about the lead screw, whereby the motor, the reduction gear train, and the printed circuit board are isolated from the environment.

14. The system of claim 11, wherein the switch ring gear and the power ring gear have unequal numbers of teeth, a single revolution of the carrier and lead screw causing only a fraction of a revolution of the switch ring gear, the switch ring gear rotating less than a full revolution during motion of the drive nut and plunger over the total range of linear distance.

15. An actuator for shifting a gearbox, the actuator comprising:
an actuator body housing a plunger configured to move a predetermined linear distance between extended and retracted plunger positions respectively corresponding to first and second gear positions;
a drive nut threaded on a lead screw, and a compression spring disposed between the drive nut and the plunger;
a reversible motor, and a reduction gear train configured to be driven by the motor, the gear train being connected to the lead screw, the motor configured to rotate at relatively high speed and low torque and the lead screw configured to rotate at relatively high torque and low speed by virtue of the reduction gear connection, the motor configured to be energized by a command signal to rotationally drive the lead screw via the reduction gear train to linearly move the plunger between the extended and retracted plunger positions;
a position sensing array including a printed circuit board having at least two Hall effect sensing circuits, and at least one magnet carried by the reduction gear train and rotationally movable relative to the at least two Hall effect sensing circuits, wherein a first of the at least two Hall effect sensing circuits provides a first output signal indicative of the extended plunger position, and a second of the at least two Hall effect sensing circuits provides a second output signal indicative of the retracted plunger position, the at least two Hall effect sensing circuits configured to signal if a desired plunger position has been achieved and trigger an error code if the desired plunger position has not been achieved within a predetermined response time, wherein each of the first and second Hall effect sensing circuits have three signal states: a positive position state, a transition state and a negative position state; wherein the positive position state has a first current, the negative position state has a second current less than the first current, and the transition state has a falling current from the first current to the second current, and wherein in the extended plunger position the first Hall effect sensing circuit corresponds to its first current and the second Hall effect sensing circuit corresponds to its second current, and wherein in the retracted plunger position the second Hall effect sensing circuit corresponds to its first current and the first Hall effect sensing circuit corresponds to its second current.

16. The actuator of claim 15, wherein the first and second currents are positive.

17. The actuator of claim 15, wherein the first and second Hall effect sensing circuits having the second current after the predetermined response time are configured to trigger the error code.

18. The actuator of claim 15, wherein achieving the desired plunger position with the predetermined time is configured to illuminate an indicator light.

\* \* \* \* \*